(12) United States Patent
Kapusta et al.

(10) Patent No.: US 8,456,340 B2
(45) Date of Patent: Jun. 4, 2013

(54) SELF-TIMED DIGITAL-TO-ANALOG CONVERTER

(75) Inventors: Ronald Kapusta, Bedford, MA (US); Junhua Shen, Cambridge, MA (US); Doris Lin, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 124 days.

(21) Appl. No.: 13/085,887

(22) Filed: Apr. 13, 2011

(65) Prior Publication Data
US 2012/0262315 A1    Oct. 18, 2012

(51) Int. Cl.
*H03M 1/66*    (2006.01)

(52) U.S. Cl.
USPC .......................................... 341/144; 341/120

(58) Field of Classification Search
USPC .................. 341/144, 172, 120, 169, 118, 161, 341/141, 155, 156
See application file for complete search history.

(56) References Cited

U.S. PATENT DOCUMENTS

| | | | |
|---|---|---|---|
| 3,624,639 A | 11/1971 | Isaacs | |
| 4,099,260 A | 7/1978 | Lynes et al. | |
| 6,828,927 B1 | 12/2004 | Hurrell et al. | |
| 7,015,841 B2 * | 3/2006 | Yoshida et al. | 341/120 |
| 7,095,345 B2 | 8/2006 | Nguyen et al. | |
| 7,688,236 B2 * | 3/2010 | Di Giandomenico et al. | 341/120 |
| 7,834,793 B2 | 11/2010 | Carreau et al. | |
| 2008/0252503 A1 * | 10/2008 | Chang et al. | 341/144 |
| 2009/0009375 A1 | 1/2009 | Mathe et al. | |
| 2009/0066552 A1 | 3/2009 | Quinn et al. | |
| 2009/0236908 A1 | 9/2009 | Park | |
| 2010/0176979 A1 | 7/2010 | Hurrell et al. | |

OTHER PUBLICATIONS

Yang et al., "A 1 GS/s 6 Bit 6.7 mW Successive Approximation ADC Using Asynchronous Processing," IEEE Journal of Solid-State Circuits, vol. 45, No. 8, pp. 1469-1478, Aug. 2010.
Chen et al., "A 6-bit 600-MS/s 5.3-mW Asynchronous ADC in 0.13-µm CMOS," IEEE Journal of Solid-State Circuits, vol. 41, No. 12, pp. 2669-2680, Dec. 2006.
Craninckx et al., "A 65fJ/Conversion-Step 0-to-50MS/s 0-to-0.7mW 9b Charge-Sharing SAR ADC in 90nm Digital CMOS," IEEE International Solid-State Circuits Conference, Digest of Technical Papers, ISSCC 2007, pp. 246-600, Feb. 2007.
Yoshioka et al., "A 10-b 50-Ms/s 820- µW SAR ADC With On-Chip Digital Calibration," IEEE Transactions on Biomedical Circuits and Systems, vol. 4, No. 6, pp. 410-416, Dec. 2010.
International Search Report and Written Opinion of the International Searching Authority in counterpart International Application No. PCT/US2012/033141, report dated Jun. 21, 2012.

* cited by examiner

*Primary Examiner* — Joseph Lauture
(74) *Attorney, Agent, or Firm* — Kenyon & Kenyon LLP

(57) ABSTRACT

A tracking module that tracks the operation of a digital-to-analog converter (DAC). The DAC tracking module may be included on-chip with a DAC, and be formed with similar circuit components as a DAC. The DAC tracking circuit may output a signal indicating that the DAC within a SAR ADC has settled to an approximate value during each bit conversion. A differential solution is also provided. Power may be optimized because optimal conversion speed may be achieved, and a comparator within the DAC may be turned off or placed in a standby mode at the end of bit conversions, and before the next conversion cycle in response to the signal output by the DAC tracking module.

17 Claims, 8 Drawing Sheets

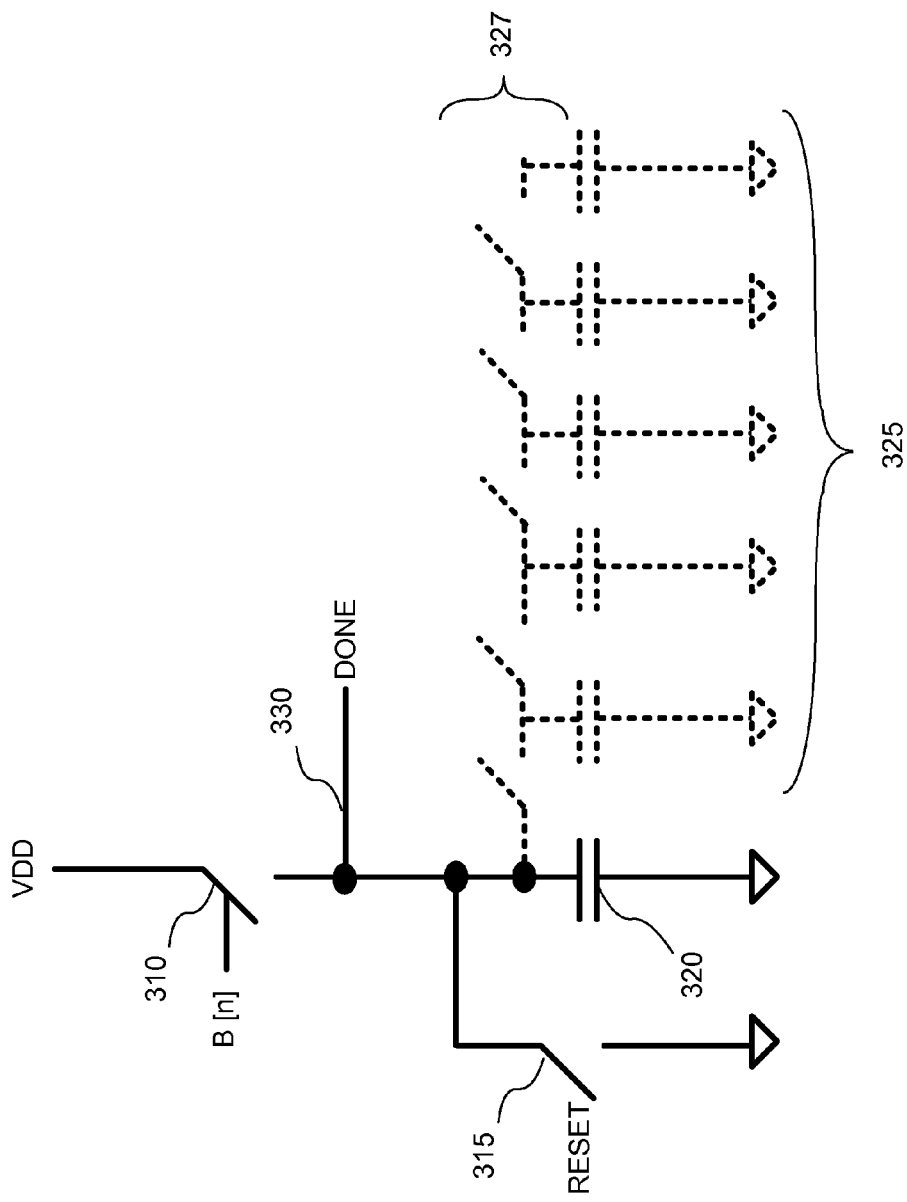

SELF-TIMED DIGITAL-TO-ANALOG CONVERTER

FIELD OF INVENTION

The present invention relates to signal processors, and more particularly to a digital-to-analog converter (DAC) that may be self timing.

BACKGROUND

DACs are common in modern integrated circuits, particularly in switched capacitor CMOS designs. They have uses in many applications, including analog-to-digital converters (ADC) architectures such as pipelined and successive approximation (SAR) ADCs. Depending on the application, key performance metrics can be the DAC settling speed and settling time. Settling is a phenomenon that arises in DACs, such as charge redistribution, current and resistor-ladder. When a DAC is set to a new configuration, an output voltage may fluctuate due to various reasons for an indeterminate amount of time before arriving at a reliable value. The output voltage should not be processed by other system components until it completes settling and, therefore, settling speeds limit overall throughput of the DAC.

A conventional 3-bit charge redistribution DAC 100 is shown in FIG. 1. It is composed of binary-weighted capacitors 102, 104.1, 104.2 and 104.3 with respective capacitances of 1C, 1C, 2C and 4C. The DAC input is a 3 bit binary digital word with each bit controlling a respective switch of the switches 106.1, 106.2 and 106.3 connected to the capacitors. The other side of the switches 106.1, 106.2 and 106.3 goes to a reference voltage VREF or ground GND depending on the corresponding bit of the DAC input word. Typically, a digital "1" controls a corresponding switch to connect to the reference voltage VREF and a digital "0" controls a corresponding switch to connect to ground GND. The DAC output is determined by an equation of Vout=VREF*Cselected/Ctotal, in which Cselected is the amount of capacitance selected by the DAC word, and Ctotal is the sum of all the capacitance. For example, if the DAC code is 101, the capacitors 104.1 and 104.3 are selected by connecting the switches 106.1 and 106.3 to the reference voltage VREF, and the switch 106.2 connects the capacitor 104.2 to the ground GND. The output would be Vout=VREF*(4C+1C)/(4C+2C+1C+1C)=⅝*VREF. However, the DAC may not settle on an output Vout immediately in response to digital logic. Therefore, some time has to be allocated to allow the DAC to settle to an appropriate output voltage Vout for each respective digital code word to be converted.

In a typical switched capacitor (charge redistribution) digital-to-analog converter (DAC), the operation of the DAC may be affected by a number of conditions. For example, a DAC may operate faster at lower temperatures, or when a high supply voltage is applied. Another condition that may affect DAC operation may be fabrication processes (such as slow or fast corners). By allocating a fixed DAC time during bit trials for the DAC to settle to a value (i.e., settling time), the worst case conditions have to be considered (e.g., slow corner from the fabrication process, low supply voltage and high temperature, or, in general, process, voltage and temperature (PVT) variations). In addition, no matter the number of bits that a DAC is designed to convert, the most significant bit (MSB), typically, requires the greatest amount of time to convert. Therefore, the fixed DAC time must account for these conditions, if a desired level of accuracy is to be attained. As a result, the fixed DAC time is set for these worst case conditions, and is used inefficiently when the worst case conditions do not occur. For example, the DAC may complete its operation, settled to a output value, and remain in substantially a steady state as the fixed time clock times out. Similarly, the other components forming the ADC may have also completed processing and may be standing idle also waiting for the conversion result from the DAC. It would be beneficial if the DAC could indicate when it completed converting the input signal (i.e., settled to an output value), and allow the DAC to operate according to its operating conditions instead of a fixed time period.

The inventor has recognized a solution to the above problem and has developed a method and a device for realizing the above described benefits. As a result, part of the DAC settling time may be saved, and be allocated to other components of the signal supply chain, all of which may result in lower overall power consumption, and improved noise performance of the DAC and related devices.

BRIEF DESCRIPTION OF THE DRAWINGS

FIG. 3B illustrates a digital-to-analog converter tracking circuit according to a second embodiment of the present invention.

DETAILED DESCRIPTION

Embodiments described in the present disclosure may provide a self-timed DAC. The self-timed DAC may include an auxiliary circuit that has similar resistance and capacitance properties as a capacitor array within a DAC. During operation, the auxiliary circuit may be driven as the DAC is driven, using the same control inputs and supply voltages as the DAC. Voltages should be developed within the auxiliary circuit that mimic voltages developed within the DAC. These voltages may be used to determine when the DAC's operation has settled and when other processes of the analog to digital conversion process may commence. In this manner, the circuit may monitor operation of the DAC capacitor array non-invasively and may speed overall operation of the system in which it resides.

Other embodiments described in the present disclosure may provide a successive approximation register (SAR) analog-to-digital converter (ADC) that may include a digital-to-analog converter (DAC), and a tracking circuit. The tracking circuit may be configured using components such as a capacitor and a switch that may respond to an input signal that is also provided to the DAC. The input signal may be a voltage representation of a bit value. The tracking circuit may track the performance of the DAC by generating an output signal in substantially the same amount of time it takes for the DAC to resolve the bit value based on the input signal.

Yet another described embodiment may provide a method for tracking the performance of a digital-to-analog converter (DAC). The method may include receiving an input signal representative of a bit value at a tracking circuit and a DAC. The tracking circuit may in response to the input signal, actuate a switch. Upon actuation of the switch, a capacitance may charge to a voltage until the switch actuates in response to termination of the input signal. The tracking circuit may output a signal indicating the completion of the operation of the DAC.

Figure 2:
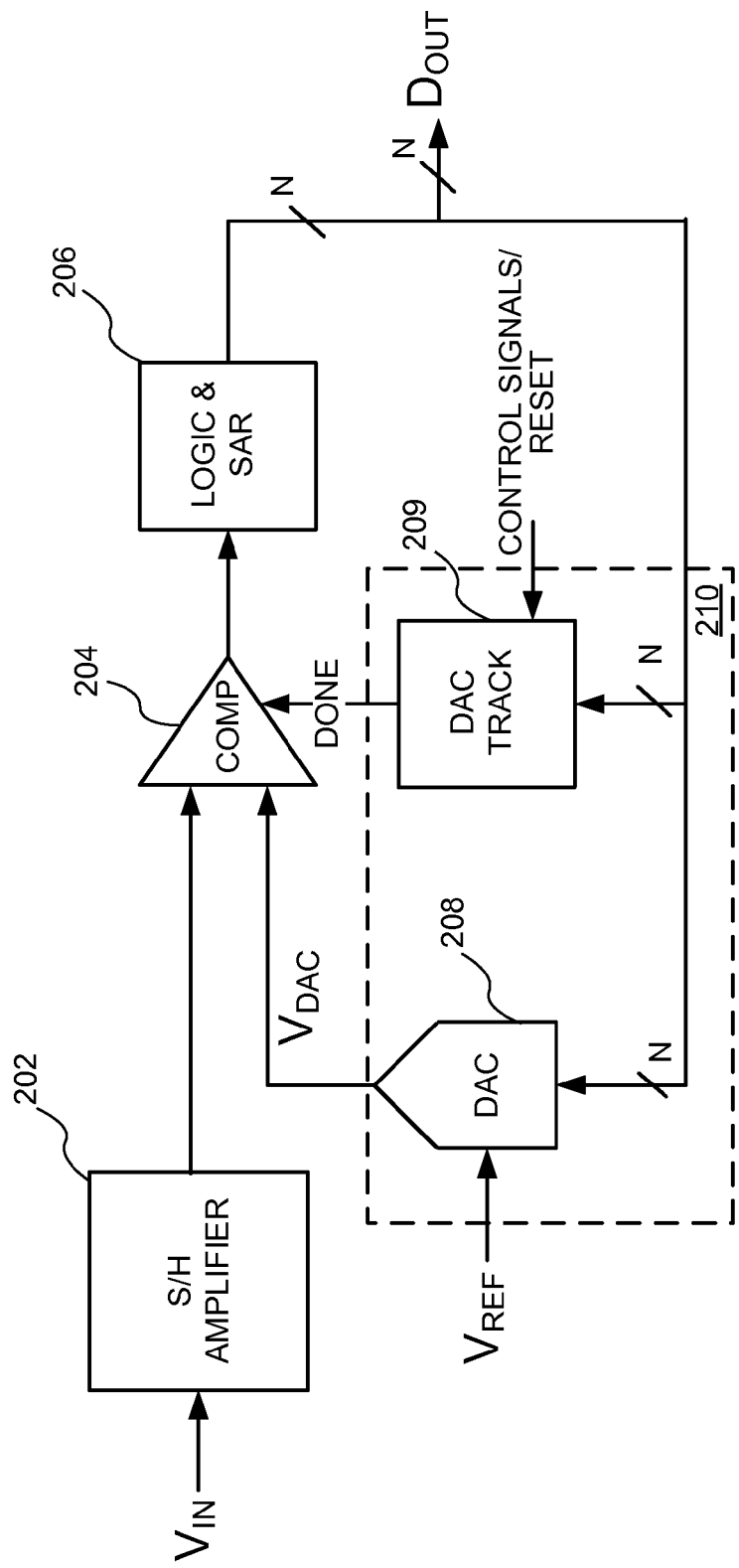
FIG. 2 illustrates an exemplary implementation of a successive approximation register (SAR) analog-to-digital converter (ADC) according to an embodiment of the present invention.

FIG. 2 illustrates a successive approximation register analog-to-digital converter (SAR ADC) implemented according to an embodiment of the present invention. The SAR ADC 200 may include a sample and hold amplifier (SHA) 202, a comparator 204, logic and successive approximation register (SAR) 206, and a digital-to-analog converter (DAC) module 210. The DAC module 210 may include a DAC 208 and a DAC tracking circuit 209. In another embodiment, the SHA 202 may be incorporated into the DAC module 210.

The SHA 202 may have an input for receiving an input signal VIN. The input signal VIN may be an analog input signal that is to be converted by the SAR ADC 200 to a digital signal. The SHA 202 may, after some time, provide an amplified analog version of VIN to a first input of comparator 204. The comparator 204 may have a second input for receiving a reference signal from DAC 208 of DAC module 210. The comparator 204 may have an output to logic 206. The logic 206 may include combinatorial control logic and a successive approximation register (SAR). Logic 206 may have an input to receive an output from the comparator 204. Logic 206 may also have an output to output a signal based on the control logic response to at least one or more of the signals received from the comparator, the state of the SAR, and/or other parameters. The output from logic 206 may be a N-bit digital code that may be output from the SAR ADC 200. The N-bit digital code may represent the converted analog input signal VIN. The N-bit digital code may be provided to DAC tracking circuit 209 and DAC circuit 208 in DAC module 210. The DAC tracking circuit 209 may have an input to receive a signal output by the logic 206, and an output connected to comparator 204. DAC module 210 may also have inputs to, for example, accept a reference voltage, for example, voltage VREF, and for receiving control signals such as RESET. DAC module 210 may have an output connected to comparator 204. Although shown separately, the DAC tracking circuit 209 may be incorporated into the DAC 208, in which case the DAC 208 may have an additional output to output a DAC "done" output signal.

In operation, the input signal for conversion from analog to digital may be signal VIN, that may be applied to SHA 202. SHA 202 may sample input signal VIN, amplify the sample, and hold it for the comparator 204. Based on a control signal such as a clock signal (not shown), the SHA 202 may output an analog signal to the comparator 204 for comparison to another signal. The comparator 204 may receive the analog signal output from the SHA 202, and an input signal VDAC from the DAC 208 in DAC tracking module 210. The comparator 204 may compare the analog signal received from the SHA 202 to the analog signal VDAC received from the DAC module 210. The result of the comparison may be output, as a comparison output signal, from the comparator 204 to the logic 206. The logic 206 based on the output signal received from the comparator 204 may determine a digital value for the comparison output signal received from the logic 206. The determined digital value may be a N-bit digital signal, and may be output from the SAR ADC 200 as DOUT. The determined digital value may also be provided to the DAC module 210, and commonly to DAC 208 and DAC tracking circuit 209.

Figure 1:
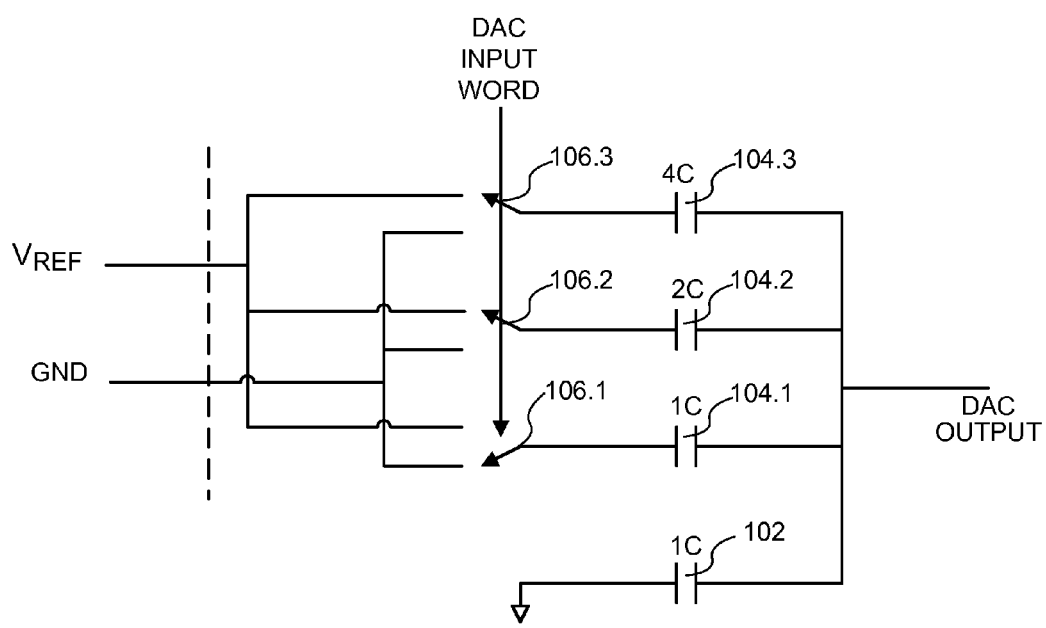
FIG. 1 illustrates an exemplary switched capacitor converter (DAC).

The DAC 208 may operate in the same manner as known DACs. The DAC 208 may be a switched capacitor (or charge redistribution) DAC as shown in FIG. 1. For example, the DAC 208 may receive an input reference signal VREF for comparison to the logic 206 output signal DOUT. Based on the results of the comparison, the DAC 208 may output its determination of the digital signal value as the analog signal VDAC.

The DAC tracking module 209 may also receive the output signal DOUT, and based on which bits of DOUT change, will produce a result indicating when the DAC has settled to a voltage of appropriate accuracy. For example, if the most significant bit of DOUT changes from a 0 to a 1, the DAC tracking module 209 may wait some delay before indicating when the DAC has settled. If, however, a less significant bit of DOUT changes from a 0 to a 1, the DAC tracking module 209 might wait some different delay before indicating when the DAC has settled. The difference in these delays might correspond to the difference in DAC settling behavior, perhaps due to differences in the sizes of the DAC capacitors or other factors. The appropriate accuracy can be determined by the circuit components forming the DAC tracking module 209. Once the DAC tracking module 209 has completed operating on the signal DOUT, it may output a signal indicating the completion of the operation. The DAC tracking module 209 may be formed from the same circuit components that form the DAC 209. Accordingly, the DAC tracking module 209 may respond to the same environmental and circuit inputs (e.g., variations in VDD and the fabrication process) as the DAC 208. For example, the circuitry of the DAC 208 in response to certain circuit conditions may operate more slowly or rapidly. In the case of the DAC 208 operating more rapidly (e.g., when VDD is higher than normal, temperatures are lower than normal, and the like), the DAC 208 may arrive at its output value and stand idle waiting for the comparator to accept the DAC 208 output. By standing idle, the DAC 208 is wasting power and not maximizing its efficiency. The DAC tracking module 209 may also process the DOUT signal, and mimicking the operation or the DAC 208 may also arrive at an output value at substantially the same time as the DAC 208. The DAC module 210 may output a signal (DONE) to comparator 204 indicating that the DAC 208 has finished processing the output signal DOUT, and triggering the comparator 204 to start comparing the DAC 208 output and the input signal.

Alternatively, the ADC 200 may employ a clock that may trigger the comparator 204 to begin its comparison of the DAC 208 output and the input signal. Comparator 204 upon receipt of the DONE signal from DAC tracking module 209 may begin making comparisons of the DAC 208 output and the SHA 202 output, instead of waiting for a clock signal to time out. The comparator 204 may include a latch that may be held in reset until the DAC tracking module 209 outputs a binary DONE signal, at which point the comparator 204 may begin its comparison. The DONE signal may also be compared to a threshold to confirm the DONE signal. The DONE may be confirmed, for example, by a logic buffer at the output of the DAC tracking module 209. The threshold may be when the capacitor charges to VDD/2 based on the logic buffer including NMOS and PMOS devices of equal strength.

Figure 3A:
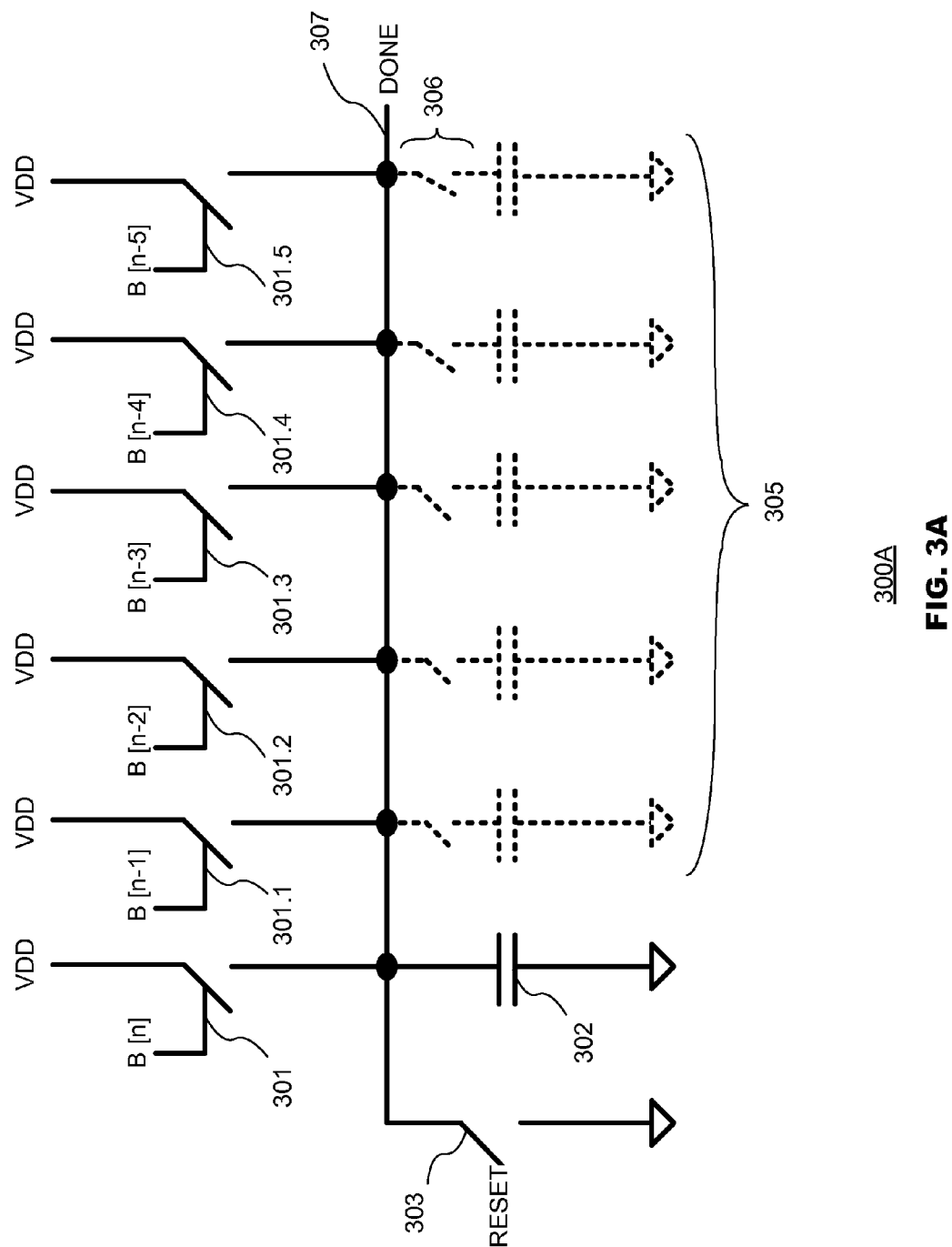
FIG. 3A illustrates a digital-to-analog converter tracking circuit according to a first embodiment of the present invention.

FIG. 3A shows an exemplary embodiment of a DAC tracking module according to a first embodiment of the present invention. The exemplary DAC tracking module 300A of FIG. 3A may include a plurality of switches 301-301.5, an output 307, a reset switch 303, a capacitive device 302, and optional capacitive devices 305. The number of switches 301-301.5 in the plurality of switches may depend on the number of bits that the DAC, which is to be tracked (for example, DAC 208 of FIG. 2), is designed to convert. The number of switches 301-301.5 may, in some embodiments, correspond to the number of bits to be converted. Each of the switches 301-301.5 may connect to the capacitive device 302. Each switch 301-301.5 may be sized differently, so the capacitive device 302 may charge at a different rate and to a different voltage depending on the selected switch. The switches 301-301.5 may be transistors that may be sized differently from one another to provide different performance characteristics. For example, the switches 301-301.5 may be sized corresponding to the respective bit location in the input digital code B[n]. The control signals such as digital code B[n] may be applied to a gate terminal (i.e., control input) of a respective switch 301-301.5 to actuate the switch.

In the illustrated example, the DAC (to be tracked) may be expected to convert a 6-bit digital code into an analog signal, in which case, six switches of different sizes may be used. Each of the plurality of switches 301-301.5 in DAC tracking module may be connected to a supply voltage, such as VDD, and to a common node. Each switch 301-301.5 may have a different code applied to it representative of each bit of the respective digital code to be converted. Operation of the DAC and the DAC tracking module 300A may be synchronized by application of the multi-bit digital code. For example, during a bit trial, switch 301 may be actuated by the n bit of the digital code B[n] that is representative of the most significant bit (MSB) of the digital code. For a DAC, the MSB usually takes the longest time to convert, so the switch 301 may be sized to allow an approximate amount of time for the capacitive device 302 to charge. The capacitive device 302 may charge for the duration of the applied digital code to an appropriate voltage, where the appropriate voltage may be indicative of how long the DAC should take to convert the same digital code. The appropriate voltage will be output at output 307 from the DAC tracking module 300A as a "Done" signal. A comparator (not shown, but such as comparator 204 of FIG. 2) may then reset. To reset the DAC tracking module 300A, the RESET switch 303 may be actuated, and the capacitive device 302 may be discharged (in this configuration to ground, or VSS). After reset of the capacitive device 302, another bit trial may commence, and a digital code representative of another bit value, such as B[n−1], may be applied to a next switch, such as switch 301.1. Switch 301.1 may be sized differently from switch 301, to allow for a bit value that requires a lesser amount of time to convert than the MSB. As such, switch 301.1 may have a lower resistance value allowing more current to pass than switch 301, in which case, the capacitive device 302 may charge more quickly to its final value, which will be output as the "Done" signal at output 307. Similarly, remaining switches 301.2-301.5 may be sized to allow the capacitive device 302 to charge more quickly than the preceding switch, e.g., switches 301 and 301.1.

In an alternative embodiment, multiple capacitive devices 305 may be grouped in parallel with capacitive device 302. The multiple capacitive devices 305 may be used instead of using different switch sizes for switches 301-301.5, or to complement the different switch sizes of switches 301-301.5. For example, in combination with the differently sized switches 301-301.5, individual ones of the capacitive devices 305 may be selectively incorporated into the circuit via switches 306 to allow for an amount of capacitance appropriate (with consideration of the different switch sizes) to replicate the performance of a DAC. In another alternative embodiment, the switches 301-301.5 may be replaced with a single switch, and individual ones of the capacitive devices 305 may be placed in parallel (or in series, or both) with capacitive device 302, or may be used individually, or in some other combinations, to provide an appropriate capacitance to replicate the operation of the DAC for each individual bit trials.

Individual switches of the plurality of switches 306 may be selectively activated to couple selected combinations of capacitive devices from capacitive devices 305 in response to a control signal (not shown) received, for example, from a controller, or other device, that is either external or internal to the ADC. The control signal may be based on a digital code representing a digital bit that is to be converted by the DAC. For example, if the digital code is the most significant bit (MSB), more capacitors may be inserted in the DAC tracking module 300A. The switches 301-301.5, RESET switch 303 and switches 306 may be implemented using transistors, or similar devices. A reset switch 303 may be used to discharge the capacitive device 302 to ground (or VSS). The reset switch 303 may receive the reset signal, RESET, from a controller, or other device, that is either external or internal to the ADC in which the DAC tracking module 300A may be implemented.

In an alternative embodiment, the exemplary DAC tracking module 300B of FIG. 3B may include a switch 310, an output 330, a reset switch 315, a capacitive device 320, and optional capacitive devices 325 and optional switches 327. A first terminal of switch 310 may be connected to a supply voltage, VDD, and a second terminal of switch 310 may be connected to output 330 and a terminal of capacitive device 320. Another terminal of capacitive device 320 may be connected to ground (or VSS). Optional capacitive devices 325 may be connected via switches 327 in parallel to capacitive device 320 at a common node between capacitive device 320 and the second terminal of switch 310. Of course, various arrangements of optional capacitive devices 325 may be envisioned. For example, capacitive devices 325 may be selectively arranged in series or parallel in combination with capacitive device 320, or in place of capacitive device 320, in order to provide a suitable capacitance to track the operation of a DAC, such as DAC 208 of FIG. 2.

The switch 310 may be actuated by the application of a digital code B[n], such as the N-bit digital signal DOUT of FIG. 2. The digital code B[n] may actuate switch 310 for a length of time that allows capacitive device 320 to charge to a voltage indicative of the value corresponding to the digital signal. The length of time it takes capacitive device 320 to charge to a certain voltage corresponding to value of the digital code B[n] should also be substantially equal to the length of time it takes a DAC, such as DAC 208, to convert the digital signal, and settle to an output value. For example, a MSB bit may take a longer time to convert than a least significant bit (LSB). The voltage "Done" at output 307 may similarly rise as does the voltage on the charged capacitive element when the digital code B[n] is no longer applied, the voltage "Done" will also settle to a final voltage indicating that the DAC has also likely settled. The voltage "Done" may be used to indicate to a comparator, such as comparator 204, that the output of a connected DAC is stable.

The digital code B[n] for actuating switch 310 may be a digital code representative of the individual bit value, e.g., MSB, that is to be converted, and each bit of the digital code B[n] may be applied to a circuit similar to DAC tracking circuit 300B. Alternatively, digital code B[n] may be a logical combination of the incoming bits, and may be applied whenever data is available for conversion.

A reset switch 315 may be used to discharge the capacitive device 320 to ground (or VSS). The reset switch 315 may receive the reset signal, RESET, from a controller, or other device, that is either external or internal to the ADC in which the DAC tracking module 300B may be implemented.

As for the optional capacitive devices 325, the individual capacitive devices may be selectively switched in or out of the circuit by switches 327. The selective actuation of the switches 327, either individually, in select groups, or as a whole, may be based on a control signal (not shown) received, for example, from a controller, or other device, that is either external or internal to the ADC in which the DAC tracking module 300 may be implemented. The control signal may be based on the digital signal B[n] that is to be resolved by the DAC. For example, if the digital signal is the most significant bit, more capacitors may be inserted in the DAC tracking module 300. The switches 327, RESET switch 315 and switch 310 may be implemented using transistors, or similar devices.

The illustrated DAC tracking modules 300A or 300B of FIGS. 3A and 3B, respectively, may be implemented on the same chip as a DAC, such as DAC 208 of FIG. 2, so DAC tracking module 300A or 300B may respond to the same supply voltage, operating temperature, and be fabricated in the same process. In an alternative embodiment, the illustrated DAC tracking module 300A or 300B may be configured in which the voltage supply may be VSS instead of VDD. In case, for example, the capacitive device 302 or 320 may be shorted to VDD.

Figure 4:
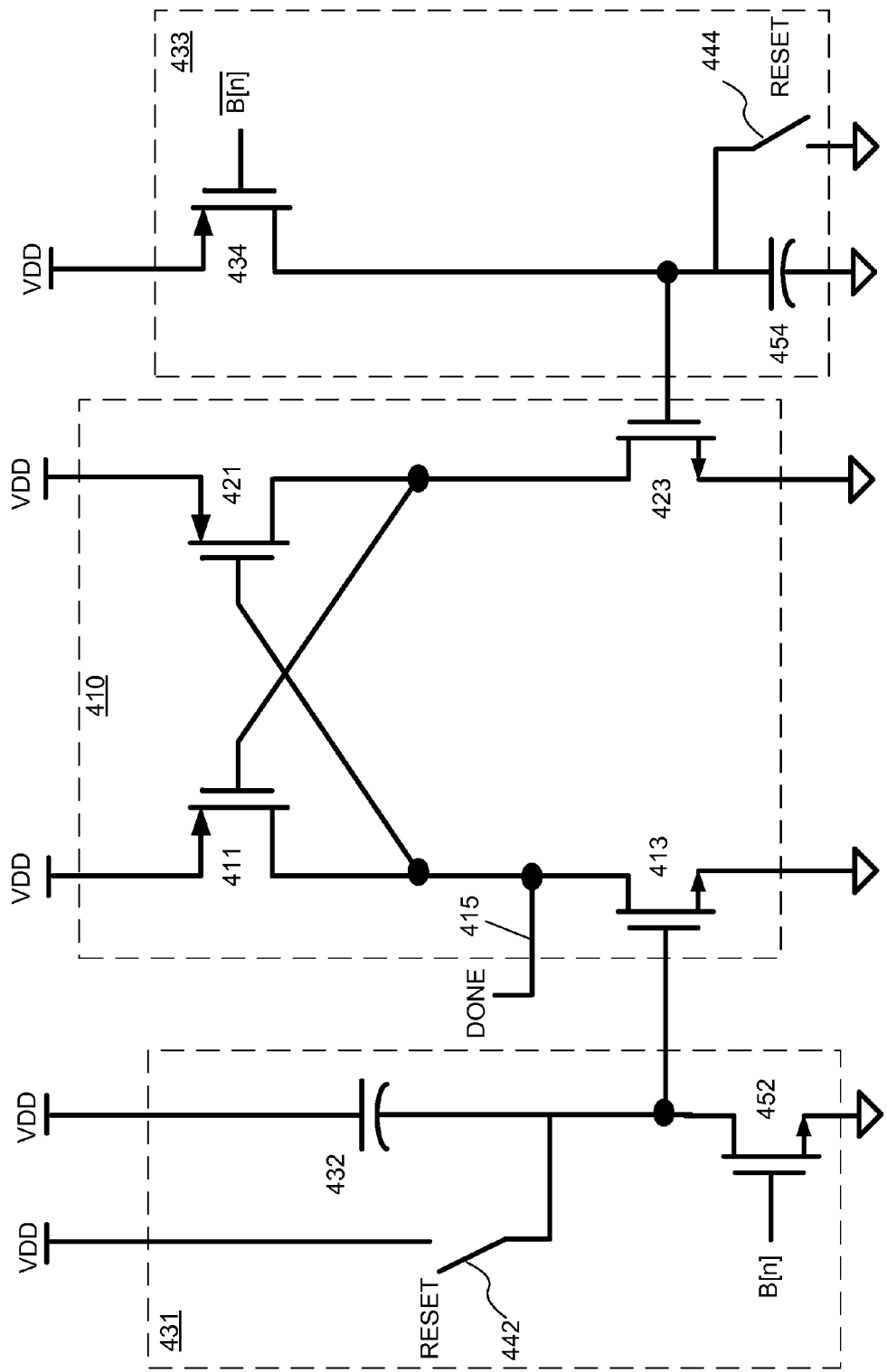
FIG. 4 illustrates an exemplary differential implementation digital-to-analog converter tracking circuit according to another embodiment of the present invention.

FIG. 4 illustrates an exemplary differential implementation of digital-to-analog converter tracking circuit according to another embodiment of the present invention. The DAC tracking module 400 of FIG. 4 may include a latch 410, and capacitive elements 431 and 433. The latch 410 may include a pair of cross-coupled PMOS transistors 411 and 421, and a pair of NMOS transistors 413 and 423.

In the illustrated embodiment, the latch may be implemented with a source terminal of each of PMOS transistors 411 and 421 connected to VDD, and respective drain terminals connected to a drain of NMOS transistors 413 and 423. A gate terminal of transistor 411 may be connected to commonly-connected drains of PMOS transistor 421 and NMOS transistor 423. Similarly, a gate terminal of transistor 421 may be connected to commonly-connected drains of PMOS transistor 411 and NMOS transistor 413. NMOS transistors 413 and 423 may have their respective source terminals connected to ground (or VSS). The gates of NMOS transistors 413 and 423 may be connected to capacitive circuits 431 and 433, such as those described with reference to FIG. 3. An output 415 of the DAC tracking module 400 may be connected at a node of the commonly-connected drain terminals of transistors 411 and 413. The output 415 may output a "done" signal.

Capacitive circuit 431 may include inputs for control signals, a reset switch 442, a capacitive device 432, a switch 452, and a connection to a gate terminal of NMOS transistor 413. Capacitive circuit 431 may be implemented using a NMOS transistor as switch 452. In such an implementation, the capacitive device 432 may be connected between VDD and a drain terminal of transistor 452. The gate terminal of transistor 452 may be used as an input on which may be received a digital input code B[n]. Similarly, capacitive circuit 433 may include inputs for control signals, a reset switch 444, a capacitive device 454, a switch 434, and a connection to a gate terminal of NMOS transistor 423. Capacitive circuit 433 may be implemented using a PMOS transistor as switch 434. In such an implementation, the capacitive device 434 may be connected between a drain terminal of transistor 434 and ground (or VSS). The gate terminal of transistor 434 may be used as an input on which may be received a digital input code $\overline{B[n]}$. The reset switch 444 may be used to discharge capacitive device 434 to ground (or VSS). Note that the capacitive devices 432 and 454 may be capacitors, transistors configured as capacitors, or other devices with capacitive characteristics.

For example, the digital code B[n] may be an output from the SAR ADC in which the DAC tracking module 400 may be implemented. Each bit of the digital code to be converted may have separate capacitive circuits 431 and 433. So, for example, the MSB of the digital code may have separate capacitive circuits, and so may every other bit to the LSB. In an alternative embodiment, one pair of capacitive circuits, such as 431 and 433, may have a single control signal B[n]. The single control signal B[n] may be a logical combination of all of the other bits in the digital code to be converted. The time between when B[n] is applied and output signal "Done" is output corresponds to how long it takes the DAC to settle for the respective bit to be converted.

In operation, the capacitive devices 432 and 434 may initially be reset by operation of the reset switches 442 and 444 to respective voltages VDD and ground (or VSS), and NMOS transistor 452 will be off thereby keeping capacitive device 432 from discharging, and PMOS transistor 434 will be off thereby keeping capacitive device 434 from charging. In which case, the "Done" signal on output 415 will start low with transistor 413 on, and transistor 423 will be off. With the voltage at the output node and on the gate terminal of PMOS transistor 421 being low, PMOS transistor 421 conducts, thereby keeping transistor 411 non-conductive because a voltage substantially equal to VDD is applied to the gate of PMOS transistor 411.

Upon application of the signal B[n] to NMOS transistor 452 and PMOS transistor 434, transistor 452 may begin to conduct, and PMOS transistor 434 may begin to conduct. Capacitive device 432 may begin to discharge from a voltage substantially equal to VDD toward ground voltage through transistor 452, and capacitive device 434 may begin to charge toward VDD through transistor 434. Eventually, the gate voltage on transistor 413 may be below threshold in which case, transistor 413 may turn off. Since transistors 413 and 423 are the same type of transistor, the threshold voltage for each is substantially identical. So nearly simultaneously with transistor 413, the gate voltage on transistor 423 may rise to its threshold voltage, and transistor 423 may turn on. This causes the voltages at the respective cross coupled gate terminals of transistors 411 and 421 to switch, in which case, the output voltage "Done" goes high, and the voltage on the gate terminal of transistor 411 goes low. A benefit of this configuration is that it is less susceptible to problems at the threshold of the transistors, and provides a differential solution that may improve the tracking accuracy of the settling time of the DAC.

In an alternative embodiment, capacitive circuits 431 and 433 may be replicated for each different bit position with a corresponding different input signal B[n]. As explained above with respect to FIGS. 3A and 3B, the switches in capacitive circuits 431 and 433, such as transistors 452 and 434, may be sized differently for each bit position and the digital code corresponding to the respective bit code. Alternatively, the capacitive devices 432 and 454 may be replaced by, or supplemented with, capacitive devices selected from a plurality of capacitive devices. The capacitive devices may be configured either in parallel or in series, to provide a suitable capacitance to track the DAC settling time.

Figure 5:
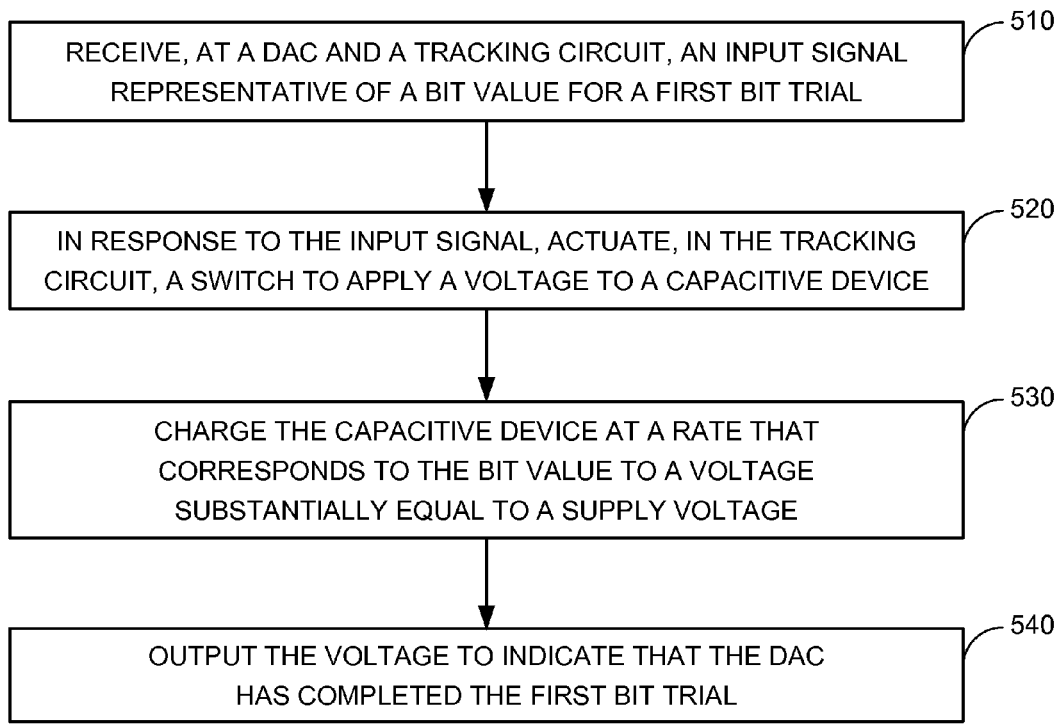
FIG. 5 illustrates an exemplary method for tracking the settling of a digital-to-analog converter according to an embodiment of the present invention.

FIG. 5 illustrates an exemplary method for tracking the settling of a DAC according to an embodiment of the present invention. In the exemplary method 500 of tracking the settling of a DAC, at a first step 510, a DAC and a tracking circuit may receive an input signal representative of a bit value for a first bit trial. In response to the input signal at 520, a switch in the tracking circuit may be actuated to apply a voltage to a capacitive device. The input signal may be used to synchronize the operation of the DAC and tracking circuit. The capacitive device of the tracking circuit, at 530, may charge at a rate that corresponds to the bit value, and to a voltage substantially equal to the voltage of the input signal. The tracking circuit may output the voltage to indicate that the DAC has completed the first bit trial at 540.

Figure 6:
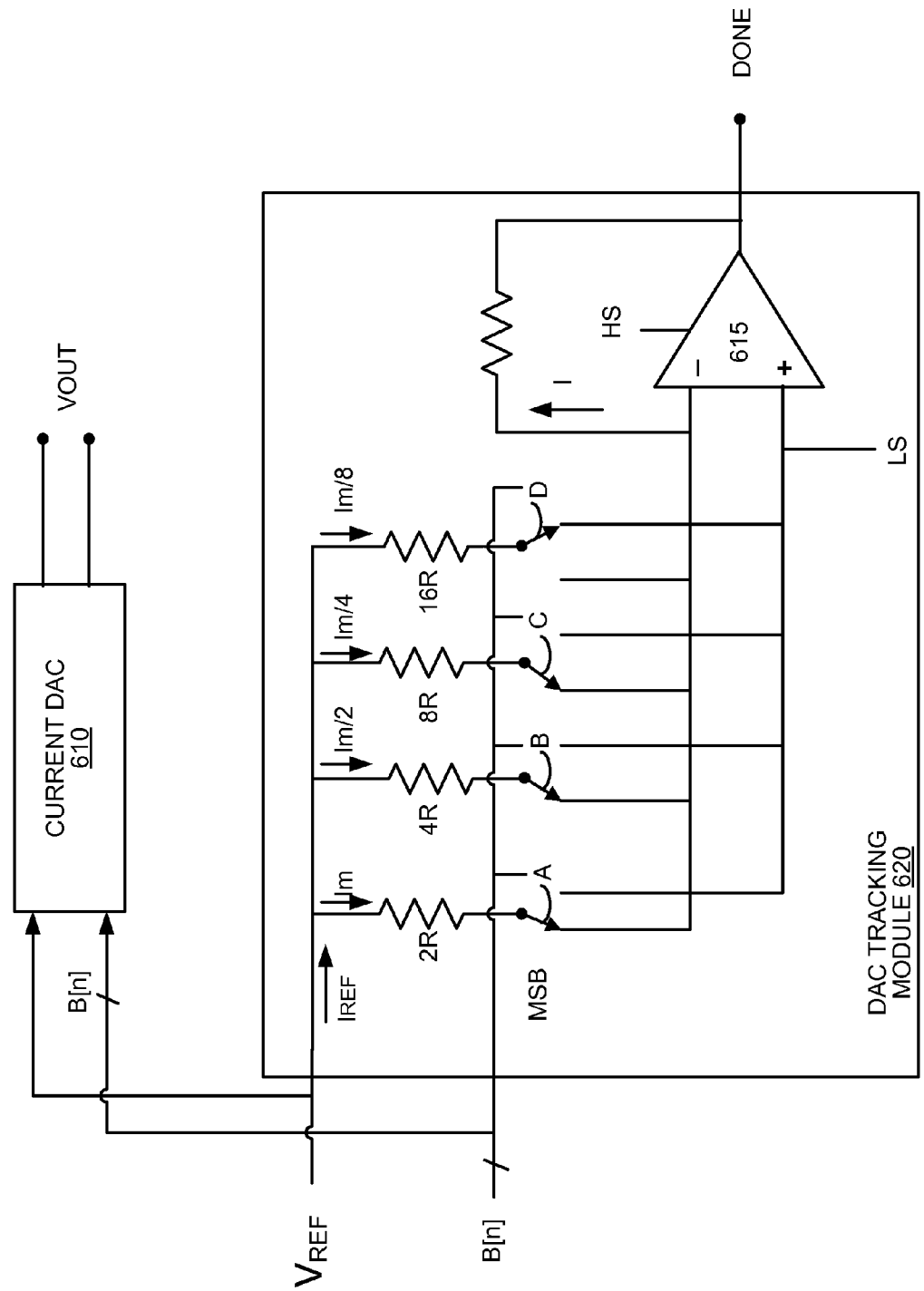
FIG. 6 illustrates a digital-to-analog converter tracking circuit according to another embodiment of the present invention.

FIG. 6 illustrates an embodiment of a DAC tracking system 600 that includes a current DAC 610 and a DAC tracking module 620. The current DAC 610 has a reference voltage VREF applied to an input and an input for the digital code B[n] to be converted to a differential output voltage VOUT. The current DAC tracking module 620 may include substantially the same components as the current DAC 610. The current DAC 610 may also exhibit certain settling properties (e.g. current fluctuation) as the applied digital code is converted. Since the operational parameters of the DAC tracking module 620 are substantially the same as the DAC 610, the DAC tracking module 620 will have similar settling properties to the DAC 610. In other words, the operational performance of the DAC tracking module 620 substantially models the operational performance of the DAC 610. The DAC tracking module 620, which is configured substantially the same as the DAC 610, may include binary sized resistors (2R, 4R, 8R, 16R) that may be switched by switches (A, B, C, D) in response to the digital code B[n]. Once the currents related to each bit (Im, Im/2, Im/4 and Im/8) have settled, an output voltage is generated, which may be output as a DAC complete signal DONE. The performance of the DAC tracking module 620 is substantially the same as that of DAC 610 because the component parts of the DAC tracking module 620 are substantially the same as the component parts of the DAC 610. In addition to a current DAC, the DAC tracking methodology may be applied to a resistor ladder DAC as described with reference to FIG. 7.

Figure 7:
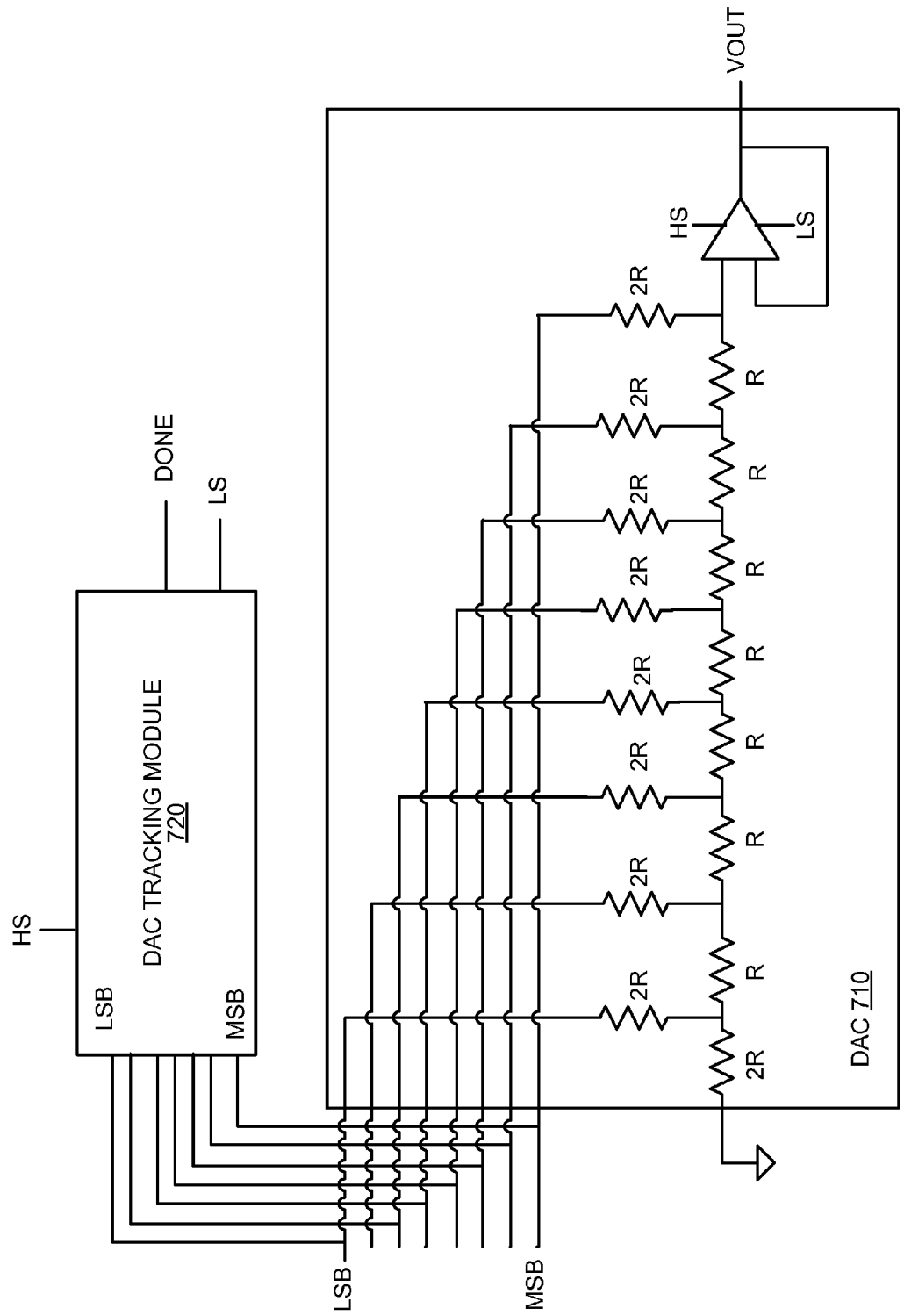
FIG. 7 illustrates a digital-to-analog converter tracking circuit according to yet another embodiment of the present invention.

FIG. 7 shows a resistor ladder DAC tracking system 700 according to yet another embodiment of the present invention. The resistor ladder DAC tracking system 700 may include a resistor ladder DAC 710 and a DAC tracking module 720. The DAC tracking module 720 may include an input for each respective bit of a digital code to converted as well as inputs for a high power supply HS (e.g., VDD) and low power supply LS (e.g., ground). In the illustrated example, the digital code is an eight-bit code. Of course, the digital code may be a 1-bit code or 14-bit code. The DAC tracking module 720 operates in the same manner as known resistor ladder DACs except that the output signal DONE represents the completion of the operation of the DAC 710. The DAC tracking module 720 may include substantially the same components as the resistor ladder DAC 710. The resistor ladder DAC 710 may also exhibit certain settling properties (e.g. voltage or current fluctuation) as the applied digital code is converted. Since the operational parameters of the DAC tracking module 720 are substantially the same as the DAC 710, the DAC tracking module 720 will have similar settling properties to the DAC 710. In other words, the operational performance of the DAC tracking module 720 substantially models the operational performance of the DAC 710.

In the illustrated example, the respective bit codes will be applied to the DAC 710 and DAC tracking module 720. Both the DAC 710 and the DAC tracking module 720 operate on the respective bits. The DAC 710 outputs an analog voltage representative of the analog value of the digital code, and the DAC tracking module 720 outputs a signal indicating that the DAC 710 has completed operation. The performance of the DAC tracking module 720 is substantially the same as that of DAC 710 because the component parts of the DAC tracking module 720 are substantially the same as the component parts of the DAC 710.

In the illustrated examples, it has been shown that a DAC may be constructed of many types of unit elements, such as capacitors, resistors, or current sources. For each type of DAC unit element (or combination thereof), a DAC tracking module can be constructed of similar elements, and to have settling properties that substantially track those of the DAC.

Several embodiments of the present invention are specifically illustrated and described herein. However, it will be appreciated that modifications and variations of the present invention are covered by the above teachings and within the purview of the appended claims without departing from the spirit and intended scope of the invention. For example, NMOS devices may be interchanged with PMOS devices, and vice versa. Applied voltages may also be changed accordingly.

We claim:

1. An analog to digital converter (ADC), comprising:
  a comparator, having an input for a voltage to be converted;
  a logic circuit having an input coupled to a comparator output and having an output for a digital code;
  a digital to analog converter (DAC), comprising an input for the digital code, and a switched capacitor coupled to a DAC input, the capacitor's contribution to the DAC output governed by a switch in response to a digital code, the DAC output coupled to the input of the comparator; and
  a tracking circuit having settling properties that match the DAC and that is driven by the digital code, an output of the tracking circuit coupled to the comparator to commence operation of the comparator for the voltage to be converted.

2. The ADC of claim 1, wherein the tracking circuit comprises:
  a switched capacitor that matches at least one switched capacitor of the DAC.

3. The ADC of claim 2, wherein the plurality of switched capacitors are binary weighted capacitors.

4. The ADC of claim 1, wherein the tracking circuit comprises:
  a switch sized according to a respective bit location in the digital code; and
  a capacitor connected to the output of the switch, and formed on a same chip as the switched capacitor in the DAC, wherein the capacitor settles to a charged voltage level in substantially the same time as the capacitor that forms the switched capacitor in the DAC.

5. The ADC of claim 1, wherein the ADC is formed on a single integrated chip.

6. The ADC of claim 1, wherein the DAC and the tracking circuit are synchronized by application of the digital code.

7. A self-timed digital-to-analog converter (DAC), comprising:
  an array of switches, each switch responsive to a digital code;
  an array of capacitors, each capacitor of the array coupled to a respective switch in the array of switches; and a tracking circuit having an input for the digital code, the tracking circuit having settling properties that match those of the capacitor array and driven by the digital code as applied to the switch array, an output of the tracking circuit indicating that the DAC output has settled to a desired accuracy.

8. The self-timed DAC of claim 7, wherein the tracking circuit further comprises:
   at least one capacitive element, wherein the capacitive element includes a capacitive device and a switch responsive to the digital code.

9. The self-timed DAC of claim 8, wherein the capacitive elements are each one of a plurality of capacitive elements, and at least one of the plurality of capacitive elements is sized differently to track conversion of different digital codes by the DAC.

10. The self-timed DAC of claim 7, wherein the tracking circuit further comprises:
    a latch connected to the output;
    a capacitor, wherein the capacitor charges when a respective switch of the plurality of switches is actuated by the application of the digital code; and
    a connection point for the output between the plurality of switches and the capacitor.

11. A successive approximation register analog-to-digital converter on an integrated circuit chip, comprising:
    a digital-to-analog converter that performs bit trials to convert a digital code output by the analog-to-digital converter into an analog signal; and
    a tracking circuit that provides a voltage indicating that the digital-to-analog converter has completed an individual bit trial.

12. The analog-to-digital converter of claim 11, wherein the tracking circuit comprises a plurality of capacitors, wherein each of the plurality of capacitors is selectively connected to a voltage in response to a signal representative of the individual bit to provide a capacitance value specific to the individual bit value.

13. The analog-to-digital converter of claim 11, wherein a switch is sized corresponding to a voltage associated with the individual bit value.

14. A method for tracking the operation of a digital-to-analog converter (DAC), comprising:
    receiving, at the DAC and a tracking circuit, an input signal representative of an expected DAC output;
    in response to the input signal, actuating, in the tracking circuit, a switch to apply a voltage to a capacitive device;
    charging the capacitive device at a rate that corresponds to the bit value; and
    outputting a signal to indicate that the DAC has settled to a desired accuracy.

15. A self-timed digital-to-analog converter (DAC), comprising:
    an array of switches, each switch responsive to a digital code;
    an array of DAC elements, each element of the array coupled to a respective switch in the array of switches; and
    a tracking circuit having an input for the digital code, the tracking circuit having settling properties that match those of the DAC element array and driven by the digital code as applied to the switch array, an output of the tracking circuit indicating that the DAC output has settled to a desired accuracy.

16. The self-timed DAC of claim 15, wherein the DAC elements comprise resistors.

17. The self-timed DAC of claim 15, wherein the DAC elements comprise current sources.

* * * * *